United States Patent [19]

Ahn et al.

[11] Patent Number: 5,306,698
[45] Date of Patent: Apr. 26, 1994

[54] METHODS FOR PRODUCING $Tl_2Ca_2Ba_2Cu_3$ OXIDE SUPERCONDUCTORS

[75] Inventors: Byung T. Ahn, Seoul, Rep. of Korea; Robert B. Beyers; Wen Y. Lee, both of San Jose, Calif.

[73] Assignee: International Business Machines Corporation, Armonk, N.Y.

[21] Appl. No.: 775,626

[22] Filed: Oct. 10, 1991

[51] Int. Cl.$^5$ .................. H01L 39/24; C01F 11/02; C01G 15/00
[52] U.S. Cl. .................. 505/475; 505/730; 505/731; 505/742; 505/783; 505/501; 252/521; 427/62; 427/126.3; 423/624; 423/635; 501/123
[58] Field of Search .................. 505/1, 783, 742, 730, 505/731; 252/518, 521; 427/62, 63, 126.3; 423/624, 635; 501/123

[56] References Cited

U.S. PATENT DOCUMENTS

| | | |
|---|---|---|
| 4,870,052 | 9/1989 | Engler et al. .................. 505/1 |
| 4,929,594 | 5/1990 | Gopalakrishnan et al. .................. 505/1 |
| 4,962,083 | 10/1990 | Hermann et al. .................. 505/1 |
| 4,988,668 | 1/1991 | Engler et al. .................. 505/1 |

FOREIGN PATENT DOCUMENTS

| | | |
|---|---|---|
| 0303249 | 2/1989 | European Pat. Off. |
| 0332309 | 2/1989 | European Pat. Off. |
| 0351323 | 7/1989 | European Pat. Off. |
| 0363940 | 10/1989 | European Pat. Off. |
| 0368210 | 11/1989 | European Pat. Off. |
| 0362694 | 4/1990 | European Pat. Off. |
| 89110897 | 8/1987 | Japan . |
| 02-124715 | 5/1990 | Japan . |
| 02-145470 | 6/1990 | Japan . |
| 02-167854 | 6/1990 | Japan . |
| 02-180716 | 7/1990 | Japan . |
| 02-196024 | 8/1990 | Japan . |
| 02-196025 | 8/1990 | Japan . |

OTHER PUBLICATIONS

Sugise et al, "The reversible reactions in Tl-Ba-Ca-Cu-O System", Jpn. J. Appl. Phys. 27(12) Dec. 1988 pp. L2310-2313.

Z. Z. Sheng et al., "Superconductivity in the Rare-Earth-Free Tl-BaCu-O System above Liquid-Nitrogen Temperature", Nature, vol. 322, pp. 55-58, 3 Mar. 1988.

Z. Z. Sheng et al., "Bulk Superconductivity at 120 K in the Tl-Ca/Ba-Cu-O System", Nature, vol. 332, pp. 138-139, 10 Mar. 1988.

R. M. Hazen et al., "100-K Superconducting Phases in the Tl-Ca-Ba-Cu-O System" Physical Review Letters, vol. 60, No. 16, pp. 1657-1660, 18 Apr. 1988.

S. S. P. Parkin et al., "Bulk Superconductivity at 125 K in Tl2Ca2Ba2Cu3Ox", Physical Review Letters, vol. 60, No. 24, pp. 2539-2542, 13 Jun. 1988.

S. S. P. Parkin et al., "TllCan-1Ba2CunO2n+3 (n-1,2,3): A New Class of Crystal Structures Exhibiting Volume Superconductivity at up to 100 K", Physical Review Letters, vol. 61, No. 6, pp. 750-753, 8 Aug. 1988.

(List continued on next page.)

Primary Examiner—Roy King

[57] ABSTRACT

Improved processes for making thin film and bulk thallium superconductors are described, as well as Tl superconductors having high critical current densities and low surface impedance. An annealing step in a reduced oxygen atmosphere is used to convert compounds containing thallium, calcium, barium and copper to a Tl-2223 superconducting phase or to convert an oxide having the nominal composition $Tl_2Ca_2Ba_2Cu_3O_x$ to a crystalline Tl-2223 phase. The oxygen pressure during annealing is controlled to be below the thermodynamic stability limit for conversion of Tl-2223 to Tl-2122 and secondary phases. Temperatures less than 880° C. are used, the oxygen pressure being sufficient to prevent excess thallium loss so that the Tl content in the final Tl-2223 phase is $Tl_{1.6-2.0}$. Electrical devices including SQUIDs can be made with these improved superconductors.

10 Claims, 8 Drawing Sheets

OTHER PUBLICATIONS

R. Beyers et al., "Crystallography and Microstructure of Tl-Ca-Ba-Cu-O Superconducting Oxides", Appl. Phys. Lett., vol. 53, No. 5, pp. 432-434, Aug. 1988.

W. Y. Lee et al., "Superconducting Tl-Ca-Ba-Cu-O Thin Films with Zero Resistance at Temperatures of Up to 120K:", Appl. Phys. Lett., vol. 4, No. 53 pp. 329-331, 25 Jul. 1988.

W. Y. Lee et al., "The Effects of Substrate Temperature on the Superconductivity Properties of Tl2Ca2Ba2Cu3O10 Films Sputter-Deposited from Stoichiometric Oxide Targets", Physica C 160, pp. 511-516, North-Holland, Amsterdam, 1989.

M. Hong et al., "Properties of Superconducting Tl2Ba2Ca2Cu3O10 Films by Sputtering", Thin Solid Films, vol. 181, pp. 173-180, 1989.

M. Kiuchi et al., "Preparation and Chemical Composition of Superconducting Oxide Tl2Ba2Can-1-CunO2n+4 with n=1, 2 and 3", Japanese Journal of Applied Physics, vol. 28, No. 3 pp. 382-385, Mar. 1989.

S. Narain et al., "Effect of Temperature on the Formation of Thallium-Based Superconductors", Supercond. Sci. Technol., vol. 2, pp. 236-248, 1989.

N. Wu et al., "Synthesis of Tl2CanBa2Cun+10６°2n(n=1,2) From Stoichiometric Reactant Mixtures", Physica C 161, pp. 302-312, North-Holland, 1989.

J. J. Ratto et al., "Monitoring Sintering/Densification and Crystallization/Grain-Growth in Tl-Based High Temperature Superconductors by Electrical Conductivity Measurements", Japanese Journal of Applied Physics, vol. 29, No. 2, pp. 244-251, Feb. 1990.

T. L. Aselage et al., "Instability of Thallium-Containing Superconductor Phases in Isothermal Equilibrium with Thallium Oxide" J. Amer. Cuam. Soc., 73, pp. 3345 et seq. (submitted in manuscript), 1990.

D. E. Morris et al., "Synthesis of High Quality Thallium Superconductors at Elevated Oxygen Pressue", Physica C 175, North-Holland, pp. 156-164, 1991.

D. M. Pooke et al., "Bulk Superconducting Y2Ba4Cu7O15- and YBa2Cu4Oo Prepared in Oxygen at 1 atm", Physical Review B, vol. 41, No. 10, pp. 6616-6620, 1 Apr. 1990.

D. E. Mooris et al., "Conversion of 124 Into 123+CuO and 124, 123 and 247 Phase Regions in the Y-Ba-Cu-O System", Physica C 168, pp. 153-160, North-Holland, 1990.

S. Jin et al., "Enhanced Flux Pinning by Phase Decomposition in Y-Ba-Cu-O" Sppl. Phys. Lett., vol. 56, No. 13, pp. 1287-1289, 26 Mar. 1990.

METHODS FOR PRODUCING TL$_2$CA$_2$BA$_2$CU$_3$ OXIDE SUPERCONDUCTORS

FIELD OF THE INVENTION

This invention relates to processes and apparatus used in forming essentially single-phase Tl$_2$Ca$_2$Ba$_2$Cu$_3$O$_x$ superconductors, and to these superconductors that exhibit improved superconducting properties above 77 K. More specifically, this invention describes high purity superconducting Tl$_2$Ca$_2$Ba$_2$Cu$_3$O$_x$ (x=10±δ) having high critical current densities and low surface impedance.

BACKGROUND OF THE INVENTION

Previous research has shown that the Tl-Ca-Ba-Cu-O quinary system contains a large number of superconducting oxides. By varying the starting cation compositions and the processing conditions, at least five phases with superconducting transition temperatures (T$_c$) above liquid nitrogen temperature (77 K) were identified: Tl$_1$Ca$_1$Ba$_2$Cu$_2$O$_x$ (Tl-1122), Tl$_1$Ca$_2$Ba$_2$Cu$_3$O$_x$ (Tl-1223), Tl$_2$Ba$_2$Cu$_1$O$_x$ (Tl-2021), Tl$_2$Ca$_1$Ba$_2$Cu$_2$O$_x$ (Tl-2122), and Tl$_2$Ca$_2$Ba$_2$Cu$_3$O$_x$ (Tl-2223). Articles describing the discovery and identification of these phases include: Z. Z. Sheng et al., Nature, Vol. 332, p. 55, 1988; Z. Z. Sheng et al., Nature, Vol. 332, p. 138, 1988; R. M. Hazen et al., Phys. Rev. Lett., Vol. 60, p. 1657, 1988; S. S. P. Parkin et al., Phys. Rev. Lett., Vol. 60, p. 2539, 1988; S. S. P. Parkin et al., Phys. Rev. Lett., Vol. 61, p. 750, 1988; and R. Beyers et al., Appl. Phys. Lett., Vol. 53, p. 432, 1988.

The superconducting transition temperature (T$_c$) of Tl$_2$Ca$_2$Ba$_2$Cu$_3$O$_x$ (Tl-2223) remains the highest yet found, i.e., 125 K. Like all superconducting oxides, the superconducting properties observed in the thallium materials at low temperatures depend critically on how the materials are processed at high temperatures. Processing studies to date have found that the phases that are formed depend on the starting composition, the use of an open or closed reactor, the annealing treatment, and the Tl$_2$O pressure. Articles describing the preparation of Tl$_2$Ca$_2$Ba$_2$Cu$_3$O$_x$ superconductors include the following: W. Y. Lee et al., Appl. Phys. Lett., Vol 53, p. 329, 1988; W. Y. Lee et al., Physica C, Vol. 160, p. 511, 1989; M. Hong et al., Thin Solid Films, Vol. 181, p. 173, 1989; M. Kikuchi et al., Jpn. J. Appl. Phys., Vol. 28, p. L-382, 1989; S. Narain et al., Supercond. Sci. Technol., Vol. 2, p. 236, 1989; N. L. Wu et al., Physica C, Vol. 161, p. 302, 1989; J. J. Ratto et al., Jpn. J. Appl. Phys., Vol. 29, p. 244, 1990; and T. L. Aselage et al., J. Am. Ceram. Soc., Vol. 73, p. 3345, 1990. Additionally, Engler et al., U.S. Pat. No. 4,870,052, issued Sep. 26, 1989, discloses a method for producing stable, bulk Tl-Ca-Ba-Cu-O superconductors. These studies indicate that relatively high temperatures are required to form the Tl$_2$Ca$_2$Ba$_2$Cu$_3$O$_x$ superconductor, above approximately 860° C. in open systems and above approximately 890° C. in closed systems.

Figure 1:
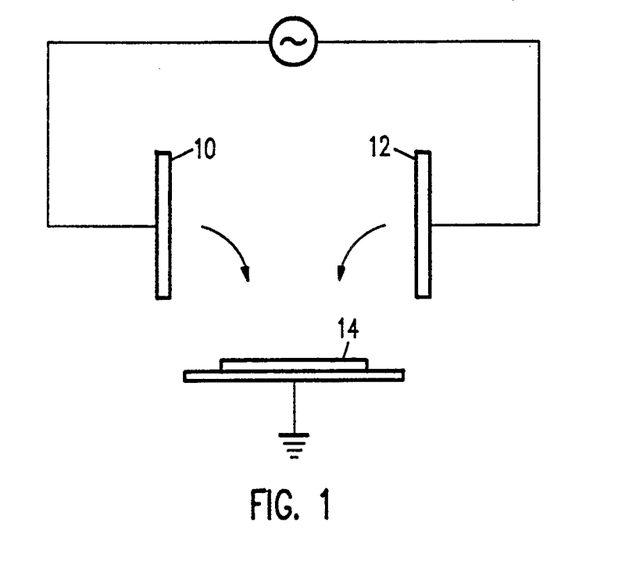
FIG. 1 is a schematic illustration of a prior art thin film sputtering system.

The inventors herein previously reported the preparation of Tl$_2$Ca$_2$Ba$_2$Cu$_3$O$_x$ superconductor films with T$_c$'s as high as 120 K in application Ser. No. 07/647,382, filed Jan. 29, 1991. Films were deposited onto MgO, SrTiO$_3$, LaAlO$_3$, and yttria-stabilized ZrO$_2$ substrates at ambient temperature in a symmetrical RF diode sputtering system using a pair of identical sputtering targets. A schematic of the deposition system is shown in FIG. 1. Targets 10 and 12 were separated by approximately 25 mm and placed directly opposite one another. A substrate 14 was positioned parallel to the center line of targets 10 and 12, but outside the discharge, to minimize resputtering of the film. The as-deposited films were not superconducting and required an ex-situ anneal at 890°–900° C. to make them superconductors. For the ex-situ anneal, the as-deposited films were sandwiched between fresh pellets of bulk Tl-2223, wrapped in gold foil, and sealed in a quartz tube initially containing 1 atmosphere oxygen. The Tl-2223 pellets were used to establish a thallium activity in the film that was within the Tl-2223 phase stability range, while the gold foil and sealed quartz tube were used to minimize thallium loss (as Tl$_2$O vapor) during the anneal. Tl-2223 films deposited onto MgO, SrTiO$_3$, and yttria-stabilized ZrO$_2$ substrates exhibited T$_c$'s as high as 120 K, but their critical current densities were rather low ($10^5$ A/cm$^2$ at 6.5 K, $10^4$ A/cm$^2$ at 77 K) and decreased rapidly in an applied magnetic field. This was due in part to the high processing temperature (890°–900° C.) needed to form the Tl-2223 phase, which produced interdiffusion and reaction with the substrates, decreased the intergranular coupling between Tl-2223 grains, and yielded rough films.

A key processing variable that is commonly ignored in the prior art is control of the oxygen partial pressure during synthesis. It will become clear from the discussion in the Detailed Description section provided below that there are important benefits to forming thallium superconductors in low oxygen pressures. In particular, low oxygen pressures enable the synthesis of Tl-2223 at a reduced processing temperature which, in turn, improves the critical current density of these thallium superconductors. The synthesis of the Tl$_2$Ca$_2$Ba$_2$Cu$_3$O$_x$ superconductor at a reduced oxygen pressure is avoided in the prior art because to those of ordinary skill in the art, previous studies have shown that thallium loss increases in low oxygen pressures. Specifically, D. E. Morris et al., Physica C, Vol. 175, p. 156, 1991, disclose the use of high oxygen pressures to suppress thallium loss during Tl$_2$Ca$_1$Ba$_2$Cu$_2$O$_x$ (Tl-2122) synthesis.

One exception to this general practice in the prior art is found in Europe patent application, 0 303,249 A2. In that application, Uno et al. describe a two-step heat treatment for preparing bulk superconductors or superconducting powders that have carbon contents less than 0.1 weight %. The first step is to calcine starting compounds of the constituent cations in hydrogen, carbon monoxide, or an oxygen pressure less than 50 torr ($6.6 \times 10^{-2}$ atmosphere), with less than 5 torr ($6.6 \times 10^{-3}$ atmosphere) oxygen pressure being preferred. The second step is to sinter the material at a higher temperature in a moderate oxygen pressure, typically one atmosphere. Uno et al. developed this two-step heat treatment in order to reduce the residual carbon content in YBa$_2$Cu$_3$O$_{6+x}$ to less than 0.1 weight %, because carbon contamination is believed to lower the critical current density of YBa$_2$Cu$_3$O$_{6+x}$. However, Uno et al. also report several examples where the two-step heat treatment is used to prepare thallium or bismuth superconductors in bulk or powder form. For the thallium examples, there is no recognition of the need to prevent thallium loss during the heating steps. Indeed, it is not clear if the experiments were carried out in a closed or open system. The temperature-oxygen pressure combinations Uno et al. used in the first heating step will produce substantial thallium losses and are far below what has been found to be necessary for making high-quality Tl-2223. Any potential benefits from the reduced temperatures used in the first heating step are negated by the second heating step at high temperature and moderate oxygen pressure. Moreover, the temperature-oxygen pressure combinations used in the second heating step produce poor quality thallium superconductors. In some cases, they are above the Tl-2223 stability limit. Due to the use of a process with a two-step heat treatment, with the second heat treatment being conducted at high temperature, the benefit of applying controlled low oxygen pressure to reduce the maximum processing temperature is ignored and therefore not disclosed. This again leads to poor superconducting performance, i.e. a low critical current density of approximately $10^3$–$10^4$ A/cm$^2$ in a bulk material produced by this method.

Furthermore, to prevent thallium loss, a closed reactor such as that shown in FIG. 1 is often used in the prior art to form the Tl-2223 superconductor. In a closed reactor, like the quartz ampoules used for thin film synthesis, the oxygen pressure increases as the samples are brought up to the annealing temperature. It will become clear from the discussion provided in the Detailed Description section below that as a result of the pressure increase, the temperature required to form Tl-2223 in a closed reactor is higher than that required in an open system if the closed reactor is initially filled with air or 1 atmosphere oxygen. The higher processing temperature in a closed reactor adversely affects the critical current density of the Tl-2223 superconductor.

The prior art has not recognized that lower oxygen pressures can be used to form thallium superconductors and therefore has not been able to lower the processing temperatures. In turn, the thallium superconductors of the prior art have not exhibited improved properties such a high critical current densities and low surface impedance.

It is therefore an object of the present invention to teach a method of forming Tl-2223 superconductors with a controlled oxygen partial pressure while maintaining minimum thallium loss, thus enabling those skilled in the art to overcome the prior art limitations discussed above.

Furthermore, it is an object of the present invention to provide a method to improve the synthesis process for producing Tl-2223 superconductors with higher $T_c$, higher critical current density, and lower surface impedance.

It is another object of this invention to teach an improved method for producing bulk Tl-2223 superconductors from stoichiometric starting material, i.e., a Tl$_2$Ca$_2$Ba$_2$Cu$_3$ cation composition.

It is another object of this invention to teach a method for decreasing the processing temperature required to form single phase Tl-2223 in thin film or bulk form by controlling the oxygen partial pressure to yield a superconducting composition having a minimum of Tl-2122 impurity.

It is another object of this invention to teach a method of forming essentially single-phase Tl-2223 in thin film or bulk form by controlling both the process temperature and the oxygen pressure.

It is another object of this invention to provide Tl-2223 superconductors which have purities in excess of about 80–90%, with $T_c$ in excess of 120 K and high critical current densities.

It is yet another object of this invention to provide electrical devices using Tl-2223 superconductors having enhanced purity and enhanced superconducting properties.

It is another object of this invention to provide a lower temperature process for producing Tl-2223 superconductors having $T_c \geq 120$ K and purity at least about 80%.

It is another object of this invention to provide thallium superconductor films which have critical current densities that are less strongly affected by external magnetic fields than prior art thallium superconductor films.

It is another object of this invention to provide thallium superconductors having higher critical densities and lower surface impedance than prior art thallium superconductors.

BRIEF SUMMARY OF THE INVENTION

The present invention recognizes that there is an upper thermodynamic stability limit of Tl-2223 and that, if the processing temperature and oxygen pressure are controlled to be below the upper thermodynamic stability limit, minimum phase conversion will occur between the Tl-2223 phase and the Tl-2122 phase. Further, since properties such as critical current density and surface impedance depend on the processing temperature, thallium superconductors having improved critical current densities and surface impedance can be produced.

This invention, therefore, relates both to improved processes for making thallium superconductors and to the improved superconductors. The principles of this invention can be applied to any technique for producing thallium superconductors, including the preparation of both bulk and thin film superconductors. In general, the technique of this invention utilizes an annealing step in a reduced oxygen atmosphere to convert compounds containing thallium, calcium, barium, and copper to a Tl-2223 superconducting phase or to convert an oxide having the nominal composition Tl$_2$Ca$_2$Ba$_2$Cu$_3$O$_x$ to a crystalline Tl-2223 superconductor phase. The oxygen pressure during heating is controlled to be below the thermodynamic stability limit for conversion of Tl-2223 to Tl-2122 and secondary phases. Temperatures less than 880° C. are utilized, the oxygen pressure being sufficient to prevent excess thallium loss so that the thallium content in the final Tl-2223 phase is Tl$_{1.6-2.0}$.

The improved thallium superconductors of this invention can be used to make various electrical devices, including SQUIDs and other types of superconductive devices. In particular, improved Tl superconductor films of nominal composition Tl$_2$Ca$_2$Ba$_2$Cu$_3$O$_x$ can be made having critical current densities in excess of $10^6$ A/cm$^2$ when measured at 77 K in magnetic fields up to 100 Oe and in excess of $10^6$ A/cm$^2$ when measured at 5 K in an applied magnetic field of 5 Tesla. These improved thallium superconductors can have a purity (Tl-2223 content) of at least about 80% in thin-film or bulk form.

These and other objects, features, and advantages of the present invention will no doubt become obvious to those of ordinary skill in the art after having read the following Detailed Description of the Preferred Embodiment which is illustrated in the various figures.

DETAILED DESCRIPTION OF THE PREFERRED EMBODIMENTS

Referring to FIG. 1, a symmetric RF diode sputtering system is shown wherein Tl-Ca-Ba-Cu-O targets 10 and 12 are employed. The sputtering system deposits an amorphous film comprising the aforesaid constituents on a substrate 14. Substrates that can be used include $LaAlO_3$, yttria-stabilized $ZrO_2$, MgO, and $SrTiO_3$ among others, with $LaAlO_3$ being preferred. The film thickness is in the range of 0.2-3 microns, with 0.2-1 micron being preferred. Such deposition preferably occurs at ambient temperature (approximately 45° C.) to prevent any crystallization within the film as it is deposited. Targets 10 and 12, as shown in FIG. 1, are prepared as disclosed in U.S. Pat. No. 4,870,052, the contents of which are incorporated herein by reference.

Figure 2:
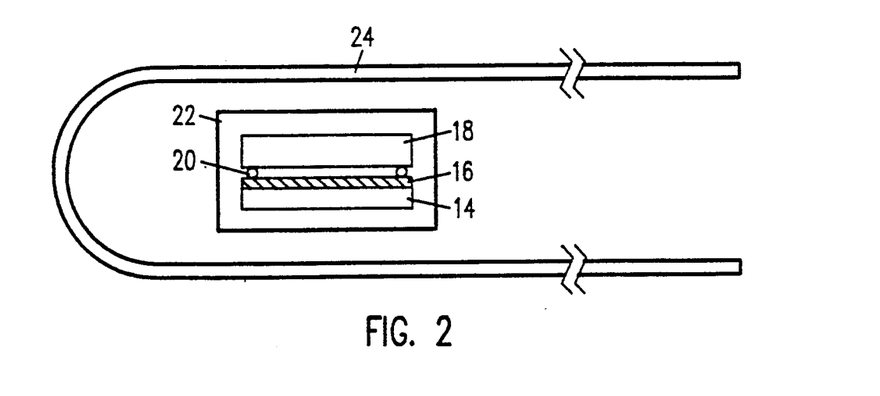
FIG. 2 is a schematic illustration of a quartz tube with a sealed insert containing a $Tl_2Ca_2Ba_2Cu_3$ oxide pellet and a $Tl_2Ca_2Ba_2Cu_3$ oxide film.

Turning to FIG. 2, after a film 16 is deposited onto a substrate 14, the substrate 14 and film 16 are placed against a pellet 18, separated by a thin gold wire 20. The pellet 18 is produced by the same method used to produce the targets 10 and 12 in FIG. 1. The entire sandwich structure, i.e., substrate 14, film 16, gold wire spacer 20, and pellet 18, is then tightly wrapped in a gold foil 22. The gold foil 22 minimizes the loss of thallium from pellet 18 and film 16. In essence, the gold foil 22 provides a contained, thallium-rich region for film 16 during a subsequent anneal.

It has been found that the desired Tl-2223 phase of film 16 is not readily obtainable if pellet 18 had been subjected previously to the elevated temperatures present during an anneal. It is therefore preferred that fresh pellets be employed each time a new anneal is carried out. This assures that a single-phase Tl-2223 film results.

After the sandwich structure is wrapped by foil 22, it is placed in a quartz tube 24 which is then evacuated to a reduced oxygen pressure and sealed. The oxygen pressure in the quartz tube is adjusted prior to sealing so that the oxygen pressure in the tube at the annealing temperature is just below the dotted line shown in FIG. 3.

Figure 3:
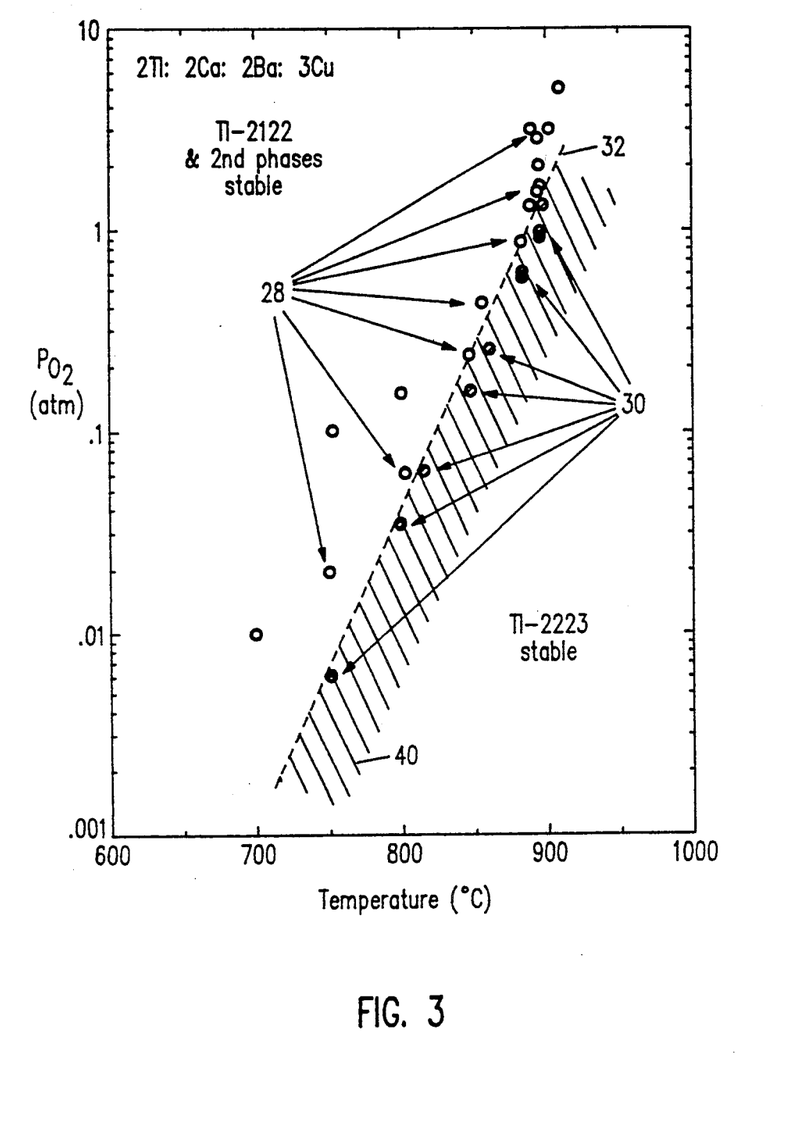
FIG. 3 is a diagram of the phases observed in 2Tl:2Ca:2Ba:3Cu samples as a function of annealing temperature and oxygen pressure.

FIG. 3 shows the phases observed in 2Tl:2Ca:2Ba:3Cu samples as a function of annealing temperature and oxygen pressure. The open circles 28 correspond to bulk samples containing Tl-2122 and second phases, while the closed circles 30 correspond to bulk samples containing Tl-2223. The dotted line 32 in FIG. 3 corresponds roughly to the upper thermodynamic stability limit of Tl-2223, i.e., the maximum oxygen pressure as a function of temperature at which Tl-2223 is a thermodynamically stable phase. At an overall cation composition $Tl_2Ca_2Ba_2Cu_3$, Tl-2223 is stable at high temperatures and low oxygen pressures, while Tl-2122 and second phases are stable at low temperatures and high oxygen pressures.

Figure 4:
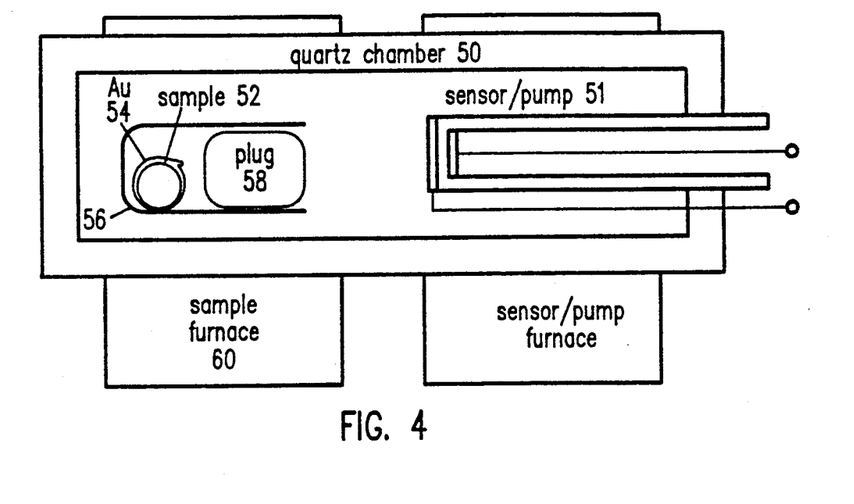
FIG. 4 is a schematic illustration of a solid state ionic cell, including a yttria-stabilized $ZrO_2$ pump and sensor system to control and monitor the oxygen partial pressure.

The data shown in FIG. 3 were obtained by annealing samples with overall cation composition $Tl_2Ca_2Ba_2Cu_3$ in a solid-state ionic cell 50 like that shown schematically in FIG. 4. The solid-state ionic cell 50 has a yttria-stabilized $ZrO_2$ sensor and pump system 51 to control and monitor the oxygen partial pressure. The starting samples for this study were made by thoroughly mixing $Tl_2O_3$, CaO, $BaCuO_2$, and CuO powders. After grinding, the sample mixture was pressed into pellets and wrapped in gold foil. The pellets were fired at 890° C. for one hour in sealed quartz tubes that initially contained one atmosphere oxygen, then furnace cooled to room temperature. Prior to the stability studies, the samples consisted of Tl-2122 and second phases (mostly calcium/copper oxides), and showed transition temperatures of 102 K. For the stability study, a sample 52 was wrapped loosely in gold foil 54 and placed in a quartz ampoule 56 with one end closed and the other end nearly closed by a quartz plug 58. The sample was annealed at a specific oxygen pressure and temperature for 1-12 hours, then rapidly cooled by turning off the sample furnace 60. The shorter annealing times were used at higher temperatures to reduce thallium loss from the samples. For a few samples, the barium source was $BaCO_3$ or $BaO_2$, rather than $BaCuO_2$. The data showed that there is no dependence of the phase stability of Tl-2223 on the barium source material. An AC four-point probe was used to measure $T_c$ and powder X-ray diffraction was used for phase analysis. The results of the phase stability study are summarized in FIG. 3.

In a preferred embodiment as shown in FIG. 2, the oxygen pressure is controlled to be just below the stability line 32 in FIG. 3, substantially in the shaded area 40 where optimum amounts of Tl-2223 are produced. For a pellet 18 weighing 0.7 grams and a 10 cm long×1.5 cm wide quartz tube 24, an initial oxygen pressure of 0.1 atm in quartz tube 24 prior to sealing is optimum when the quartz tube 24 and its contents are subsequently annealed at 850° C. for 5-10 hours to obtain the single-phase Tl-2223 film. A preferred time of application is 9 hours. Rapid heating and cooling rates are then used outside the Tl-2223 stability region to minimize the formation of Tl-2122 and second phases. Heating rates greater than 5° C. per minute are preferred. Cooling rates greater than or equal to 0.5° C. per minute are preferred.

Figure 5:
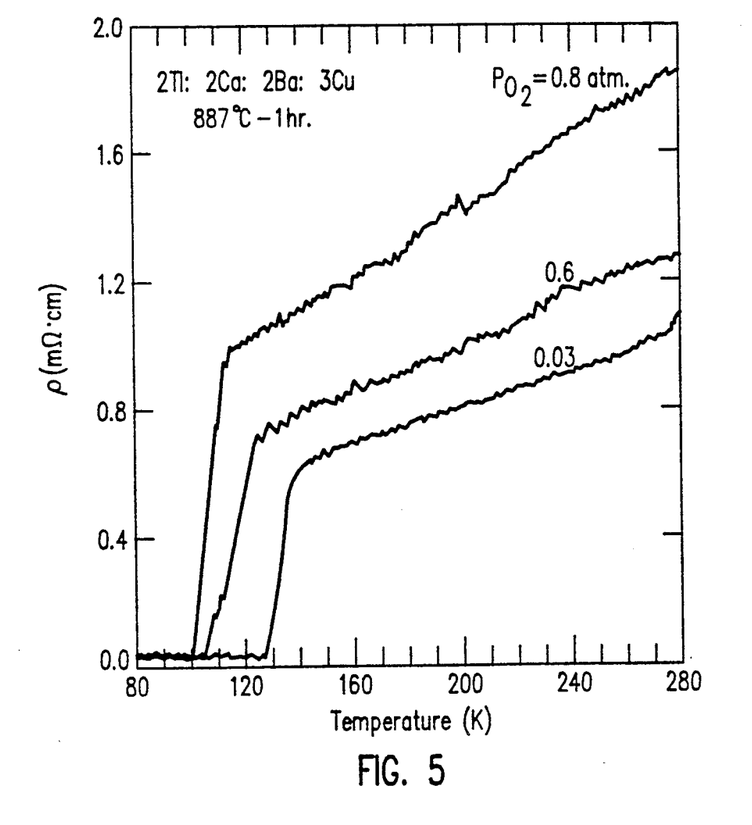
FIG. 5 shows resistivity versus temperature plots for $Tl_2Ca_2Ba_2Cu_3$ samples annealed at 887° C. for one hour in sealed quartz tubes having different initial oxygen partial pressures.

FIG. 5 demonstrates one application of the insights provided by FIG. 3. FIG. 5 shows resistivity versus temperature plots for three $Tl_2Ca_2Ba_2Cu_3$ oxide pellets that were annealed at 887° C. for one hour in sealed quartz tubes 24 with different initial oxygen pressures.

The oxygen pressures noted in FIG. 5 are the pressures inside the quartz tubes when the tubes were sealed at room temperature. The actual oxygen pressures in the tubes during the 887° C. annealing were higher. Note that $T_c$ increases from 103 K to 127 K as the initial oxygen pressure decreases from 0.8 atm to 0.03 atm. The present invention has thus produced a superconducting oxide with the highest $T_c$ (127 K) at the time the invention was made. X-ray diffraction studies of these samples revealed that the increase in $T_c$ is caused by the transformation of Tl-2122 and second phases to Tl-2223. Thus, for processing in a sealed tube (i.e., a closed system), reducing the initial oxygen pressure at room temperature in the tube lowers the annealing temperature required to form Tl-2223.

FIG. 3 provides an explanation why Tl-2122 is often observed as a second phase in $Tl_2Ca_2Ba_2Cu_3$ samples, especially those prepared in open systems at constant oxygen pressure. If a sample is heated slowly to a firing temperature of approximately 860° C. in a constant oxygen pressure (0.21-1 atm), then Tl-2122 and second phases will form during the temperature ramp up and must be converted to Tl-2223 (S. Narain et al., Supercond. Sci, Technol., Vol. 2, p. 236, 1989, cited above. This situation corresponds to moving horizontally to the right in FIG. 3, across the Tl-2223 stability limit 32. Conversely, for a $Tl_2Ca_2Ba_2Cu_3$ sample equilibrated below the Tl-2223 stability limit and then slowly cooled at constant oxygen pressure, there will be a driving force to form Tl-2122 and second phases when the Tl-2223 stability limit is exceeded. This corresponds to moving horizontally to the left of the stability line 32 in FIG. 3. Tl-2122 formation can be minimized by rapidly heating and cooling the sample outside the temperature and oxygen pressure regime where Tl-2223 is stable. Alternatively, controlled cooling across the Tl-2223 stability line 32 might be used to produce Tl-2122 with a fine dispersion of second-phase pinning centers. This would be the thallium analog of using controlled heating to convert $YBa_2Cu_4O_8$ into $YBa_2Cu_3O_{6+x}$ plus CuO pinning centers, as described by D. M. Pooke et al., Phys. Rev. B, Vol. 41, p. 6616, 1990; D. E. Morris et al., Physica C, Vol. 168, p. 153, 1990; and S. Jin et al., Appl. Phys. Lett., Vol. 56, p. 1287, 1990.

FIG. 3 further teaches that Tl-2223 can be prepared at much lower temperatures provided the oxygen pressure is below the upper stability limit and the formation kinetics are sufficiently rapid. For researchers trying to form Tl-2223 directly, either in situ or by post-annealing amorphous precursors, FIG. 3 suggests that the best chance for success lies in using low oxygen pressures and low temperatures during synthesis. For thin film synthesis, the present invention teaches that by the use of a preferred embodiment as shown in FIG. 2, low pressure/low temperature processing of amorphous precursors yields smooth Tl-2223 films with high critical current densities, low surface resistance, and minimal substrate interaction.

Figure 6A:
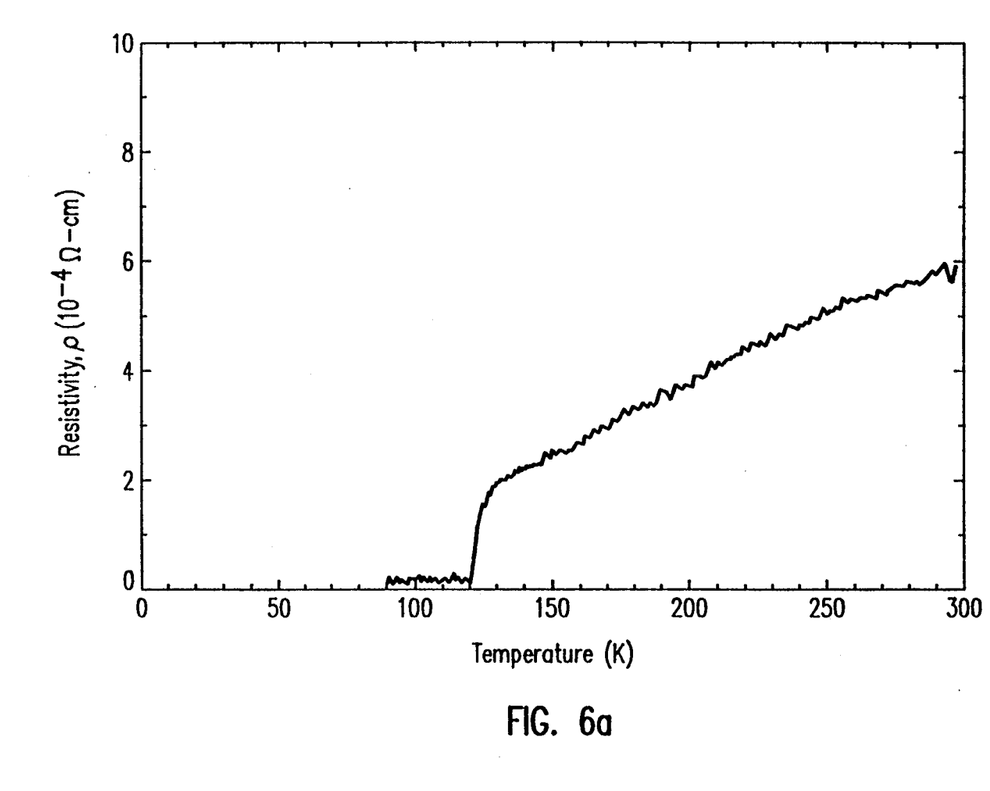
FIG. 6a plots the resistivity versus temperature of a Tl-2223 film prepared in low oxygen pressure.
Figure 6B:
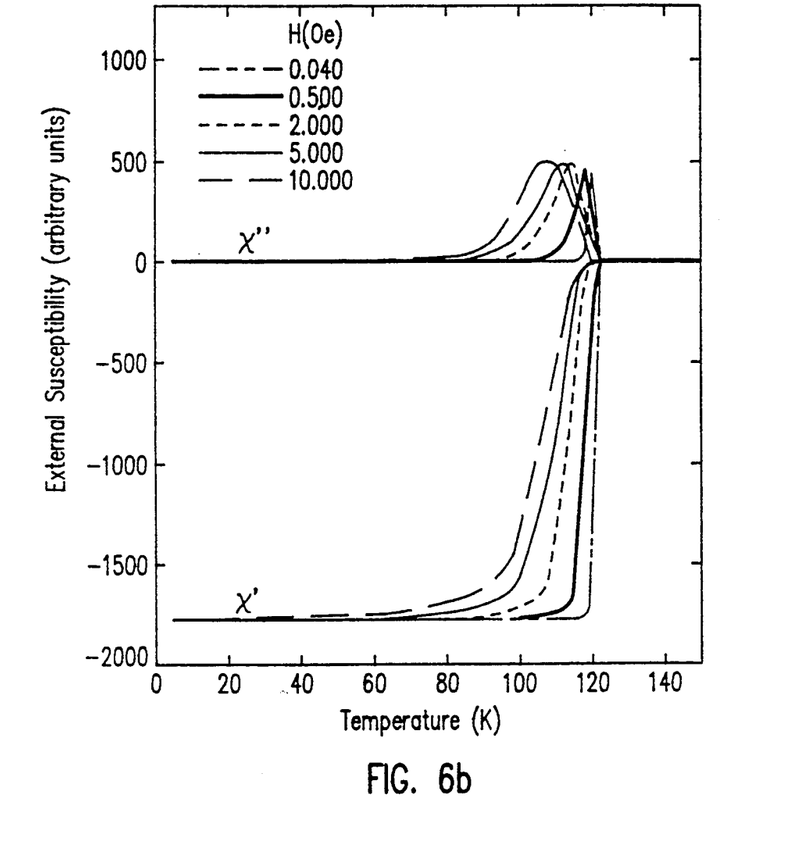
FIG. 6b plots the AC susceptibility versus temperature of a Tl-2223 film prepared in low oxygen pressure.
Figure 7:
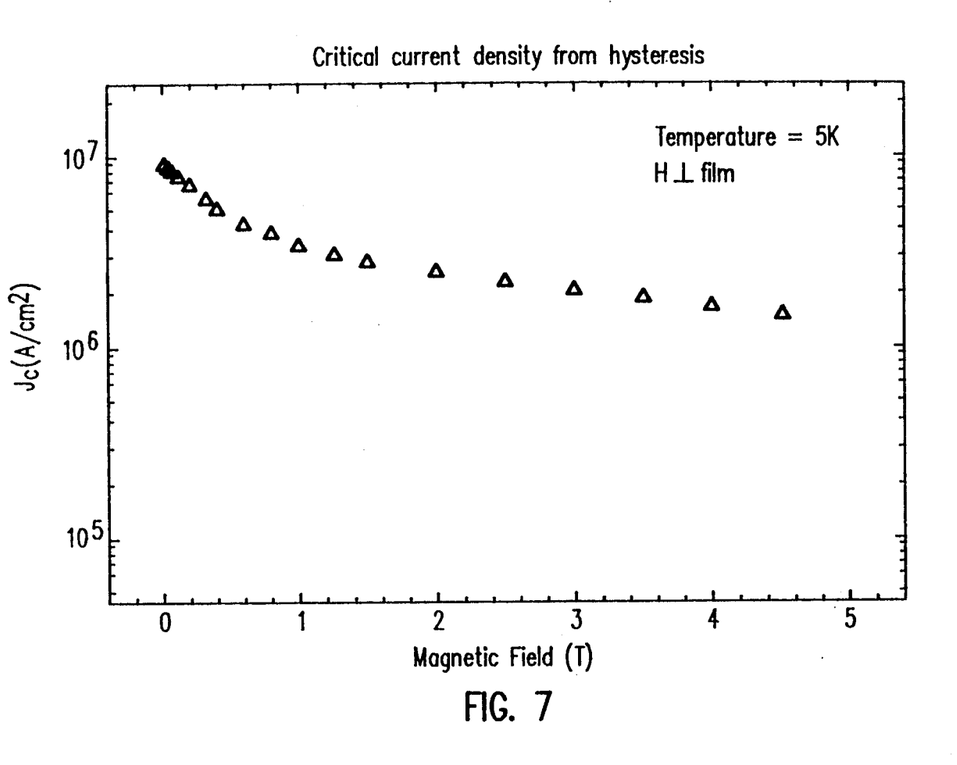
FIG. 7 plots the critical current density versus applied magnetic field at 5 K of a Tl-2223 film prepared in low oxygen pressure.
Figure 8:
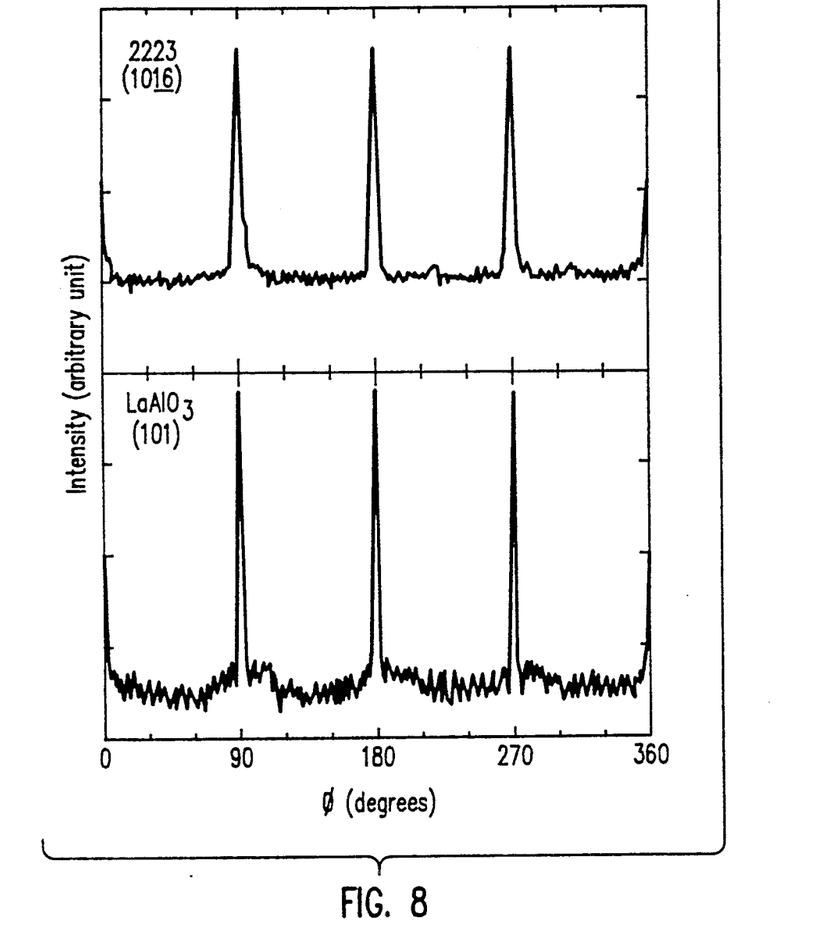
FIG. 8 plots the x-ray diffraction intensity from the Tl-2223 (1016) and the $LaAlO_3$ (101) family of peaks versus the angle around the normal of a Tl-2223 film deposited on $LaAlO_3$ and annealed at 850° C. in 0.1 atmosphere $O_2$ for 9 hours.

FIG. 6a shows the resistivity versus temperature of a Tl-2223 film prepared using the method just described, while FIG. 6b shows the AC susceptibility versus temperature. These measurements demonstrate that the superconducting transition temperature of Tl-2223 films prepared by this method is above 120 K. FIG. 7 plots the critical current density (calculated using the Bean critical state model) versus applied magnet field at 5 K of a Tl-2223 film prepared in low oxygen pressure. The critical current density with no applied field is $9 \times 10^6$ $A/cm^2$ at 5 K, and remains high in strong magnetic fields. Transport measurements on a 380 nm thick film find a critical current density of $10^5$ $A/cm^2$ below 100 K, $1.6 \times 10^6$ $A/cm^2$ at 77 K, and greater than $3 \times 10^6$ $A/cm^2$ below 60 K in magnetic fields up to 100 Oe. The surface resistance of films prepared by this method is measured to be 350 microhms at 10 GHz at 77 K. FIG. 8 shows that the processing conditions used for the preferred embodiment result in an epitaxial Tl-2223 film on a $LaAlO_3$ substrate.

Similar benefits from using low oxygen pressures may also occur for bulk synthesis. These benefits can arise even in processing methods that have little or no dynamic exchange of oxygen between the sample and a surrounding gas phase. Low oxygen pressure in the gas phase corresponds to low oxygen activity in the solid phases. For processing methods with little or no dynamic exchange, the oxygen activity in the solids can be controlled by adjusting the oxygen content in the starting materials. In particular, the oxygen activity can be lowered by using reduced oxides as starting materials, like $Cu_2O$ instead of CuO or $BaCu_2O_2$ instead of $BaCuO_2$. For example, it was found that Tl-2223 forms in sealed pellets containing $Tl_2O_3$, CaO, $BaCuO_2$, and $Cu_2O$ after annealing at 750° C. for 12 hours.

Figure 9:
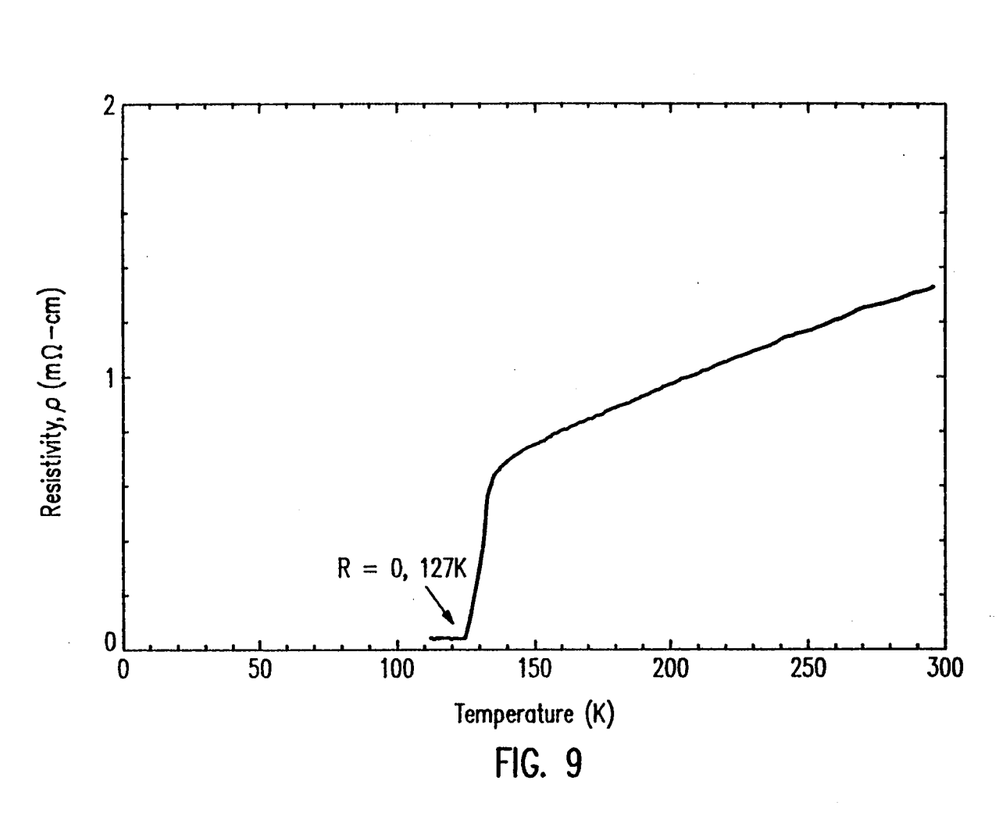
FIG. 9 plots resistance versus temperature for a Tl-2223 pellet prepared at low temperature using a reduced oxide ($Cu_2O$) as one of the starting materials.

Bulk Tl-2223 samples are made at lower processing temperatures in the following manner. Tl-2223 pellets are made by grinding and mixing CaO, $Tl_2O_3$, $BaCuO_2$, and $Cu_2O$ with an overall cation ratio $Tl_2Ca_2Ba_2Cu_3$. The pellets are wrapped tightly in gold foil and sealed in an evacuated quartz tube with negligible gas volume, followed by annealing at 750° C. for 12 hours. The pellets are then cooled to room temperature where they are reground and repressed. After rewrapping them in gold foil and resealing in an evacuated quartz tube, the pellets are heated to 800° C. in 2 hours, held at 800° C. for 12 hours, and then cooled to room temperature over several hours. FIG. 9 shows that the pellets reach zero resistance at 127 K, while x-ray diffraction indicated that the materials were nearly single phase Tl-2223.

Thallium superconductors having a nominal composition $Tl_2Ca_2Ba_2Cu_3O_x$ can be prepared at lower temperatures if the oxygen pressure is below the upper stability limit and the formation kinetics are sufficiently rapid. This also applies to the preparation of Tl-2223 directly, either in-situ or by postannealing amorphous precursors.

While the invention has been shown and described with reference to the embodiments above, it will be understood by those skilled in the art that various changes in form and detail may be made therein without departing from the essence, scope, and teaching of the invention. For example, deposition techniques besides sputtering could be used to deposit the films. Moreover, other inert substrates could be used or the substrates noted herein could be used as buffer layers on more reactive substrates (like silicon or gallium arsenide). Other techniques could be used to establish the thallium activity and reduced oxygen pressure around the film needed to form Tl-2223. There should be similar benefits to processing other Tl-Ca-Ba-Cu-O superconducting oxides in low oxygen pressures, although their thermodynamic stability limits may not be precisely the same as Tl-2223. Accordingly, the invention disclosed herein is to be limited only as specified in the following claims.

We claim:

1. A method for producing a high $T_c$ superconductor of $Tl_2Ca_2Ba_2Cu_3$ oxide from a $Tl_2Ca_2Ba_2Cu_3$ starting cation composition, comprising the steps of:
   (a) producing a substantially uniform mixture of said starting cation composition; and
   (b) performing heat treatment on said uniform mixture with a temperature from about 700 to 860 degrees centigrade and a corresponding oxygen pressure from about 0.008 to 0.5 atmosphere as shown substantially by the shaded area 40 in FIG. 3 to produce a substantially single-phase superconductor.

2. A method for producing the superconductor $Tl_2Ca_2Ba_2Cu_3$ oxide of claim 1, wherein at least one reduced oxide containing constituent elements is used in said starting cation composition.

3. The method as recited in claim 1, wherein the oxygen pressure is the range of approximately 0.01 to 0.5 atmosphere and the temperature is in the range of approximately 750 to 860 degrees centigrade.

4. The method as recited in claim 1, wherein said uniform mixture has a nominal composition of $Tl_2Ca_2Ba_2Cu_3$ oxide.

5. A method for producing a superconducting oxide film comprising constituent elements Tl, Ca, Ba, and Cu, the method comprising the steps of:
   (a) depositing an amorphous oxide film of said constituent elements on a supporting substrate under ambient conditions;
   (b) juxtaposing said amorphous film to a fresh Tl-containing pellet in a sealed environment to produce a juxtaposed film-pellet structure; and
   (c) subjecting the juxtaposed amorphous film-pellet structure of step (b) to a sub-atmospheric oxygen pressure in the range of approximately 0.01 to 0.5 atmosphere and a corresponding elevated temperature in the range of approximately 750 to 860 degrees centigrade to anneal said amorphous film to produce a substantially single phase superconductor.

6. The method as recited in claim 5, wherein said juxtaposed film-pellet structure recited in step (b) is tightly surrounded by a Tl-inert enclosing means.

7. The method as recited in claim 6, wherein said enclosing means comprises a gold foil which is wrapped about said juxtaposed film-pellet structure.

8. The method as recited in claim 5, wherein said juxtaposed film-pellet structure is further placed in a quartz tube having an internal oxygen pressure just below the dotted line shown in FIG. 3.

9. The method as recited in claim 5, wherein said supporting substrate is comprised of $LaAlO_3$ and said Tl-containing pellet is prepared from a starting powder mixture of said constituent cations in the ratio of $Tl_2Ca_2Ba_2Cu_3$.

10. A method for forming a thallium superconductor having a substantially single-phase $Tl_2Ca_2Ba_2Cu_3$ oxide including the following steps:
   providing a precursor including compounds of Tl, Ba, Ca and Cu and heating said precursor in an oxygen ambient having a pressure in the range of approximately 0.008 to 0.5 atmosphere at a temperature in the range of approximately 700° to 860° C. for a time sufficient to produce said thallium superconductor.

* * * * *